(12) United States Patent
Grover et al.

(10) Patent No.: US 8,654,570 B2
(45) Date of Patent: Feb. 18, 2014

(54) LOW VOLTAGE WRITE TIME ENHANCED SRAM CELL AND CIRCUIT EXTENSIONS

(75) Inventors: Anuj Grover, Delhi (IN); Gangaikondan Subramani Visweswaran, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 225 days.

(21) Appl. No.: 13/339,587

(22) Filed: Dec. 29, 2011

(65) Prior Publication Data

US 2013/0170289 A1  Jul. 4, 2013

(51) Int. Cl.
*G11C 11/00* (2006.01)

(52) U.S. Cl.
USPC .......................................... 365/154; 365/156

(58) Field of Classification Search
None
See application file for complete search history.

(56) References Cited

U.S. PATENT DOCUMENTS 3,971,004 A * 7/1976 Dingwall ...................... 365/156
4,852,060 A * 7/1989 Rockett, Jr. .................. 365/154

OTHER PUBLICATIONS

Kulkarni, Jaydeep P., et al: "A 160 mV Robust Schmitt Trigger Based Subthreshold SRAM," IEEE Journal of Solid-State Circuits, vol. 42, No. 10, Oct. 2007, pp. 2303-2313.
Kulkarni, Jaydeep P., et al: "Process Variation Tolerant SRAM Array for Ultra Low Voltage Applications," pp. 108-113, Design Automation Conference, 2008.
Kim, Tae-Hyoung, et al: "A High-Density Subthreshold SRAM with Data-Independent Bitline Leakage and Virtual Ground Replica Scheme," ISSCC 2007 / Session 18 / SRAM / 18.5, pp. 330, 331, and 606.
Chang, Leland, et al: "A 5.3GHz 8T-SRAM with Operation Down to 0.41V in 65nm CMOS," 2007 Symposium on VLSI Circuits Digest of Technical Papers, pp. 252-253.

* cited by examiner

*Primary Examiner* — Alexander Sofocleous
(74) *Attorney, Agent, or Firm* — Gardere Wynne Sewell LLP (57) ABSTRACT

A memory cell is formed by storage latch coupled between a true bit line node and a complement bit line node. The latch has an internal true node and an internal complement node. The cell additionally includes a first transistor that is source-drain coupled between the internal true node and a word line node. A control terminal of the first transistor is coupled to receive a signal from the complement bit line node and functions to source current into the true node during write mode. The cell further includes a second transistor that is source-drain coupled between the internal complement node and the word line node. A control terminal of the second transistor is coupled to receive a signal from the true bit line node and functions to source current into the complement node during write mode.

17 Claims, 4 Drawing Sheets

LOW VOLTAGE WRITE TIME ENHANCED SRAM CELL AND CIRCUIT EXTENSIONS

TECHNICAL FIELD

The present invention relates to integrated memory circuits and in particular to static random access memory (SRAM) integrated circuits.

BACKGROUND

Figure 1:
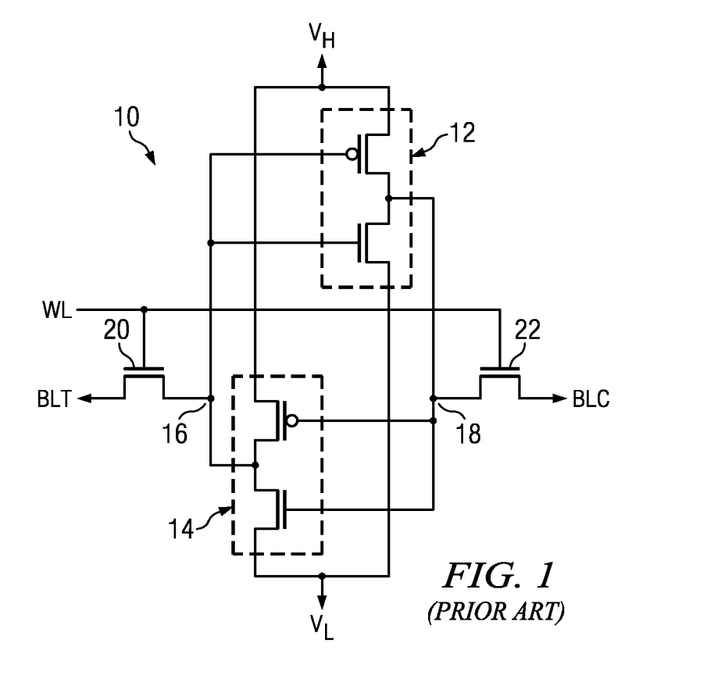
FIG. 1 is a schematic diagram of a standard six transistor static random access memory (SRAM) cell.

Reference is made to FIG. 1 which is a schematic diagram of a standard six transistor (6T) static random access memory (SRAM) cell 10. The cell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18. The cell 10 further includes two transfer (pass gate) transistors 20 and 22 whose gate terminals are coupled with a word line node and are controlled by the signal present on a word line (WL). It will be recognized that the transfer (pass gate) transistors 20 and 22 may alternatively be separately controlled by signals on a first and second word line. Transistor 20 is source-drain connected between the true node 16 and a node associated with a true bit line (BLT). Transistor 22 is source-drain connected between the complement node 18 and a node associated with a complement bit line (BLC). The source terminals of the p-channel transistors in each inverter 12 and 14 are coupled to receive a high source voltage at a high voltage $V_H$ node, while the source terminals of the n-channel transistors in each inverter 12 and 14 are coupled to receive a low source voltage at a low voltage $V_L$ node. The high voltage $V_H$ and the low voltage $V_L$ comprise a power supply set of voltages for the cell 10. Conventionally, the high voltage $V_H$ is a positive voltage (for example, 1.5V) and the low voltage $V_L$ is a ground voltage (for example, 0V). In an integrated circuit including the SRAM cell 10, this power supply set of voltages may be received at pins of the integrated circuit, or may instead be generated on chip by a voltage converter circuit which receives some other set of voltages received from the pins of the chip. The power supply set of voltages $V_H$ and $V_L$ are conventionally applied to the SRAM cell 10 at all times that the cell/integrated circuit is operational. It will be recognized that separate low voltage $V_L$ values may be provided for the sources of the nMOS transistors in the inverters 12 and 14 while separate high voltage $V_H$ values may be provided for the sources of the pMOS transistors in the inverters 12 and 14.

Figure 2:
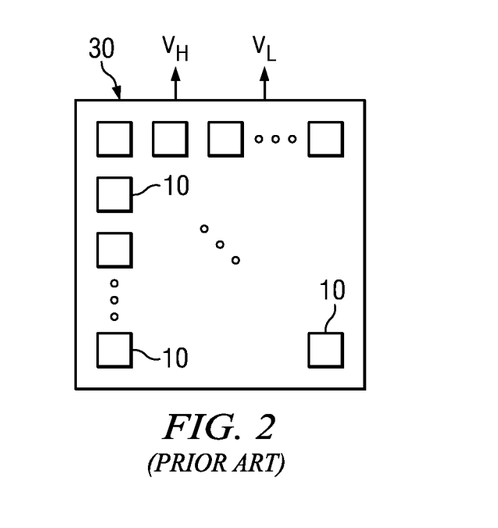
FIG. 2 shows a block diagram of a static random access memory (SRAM) array.

Reference is now made to FIG. 2 which is a block diagram of a static random access memory (SRAM) array 30. The array 30 includes a plurality of SRAM cells 10 arranged in an matrix format. The number of cells 10 included in the array 30 can widely vary depending on the circuit designer's needs. The high voltage $V_H$ and the low voltage $V_L$ of the power supply set of voltages is applied to the array 30 and distributed over the array in a manner well known to those skilled in the art to the individual ones of the included cells 10 (for application to the source terminals of the p-channel and n-channel transistors as shown in FIG. 1).

The performance of the SRAM cell 10 is constrained by two independent operations. The first operation is a read operation and the constraint concerns the time between the triggering read signal to a valid output. The second operation is a write operation and the constraint concerns the time between the triggering write signal to next possible triggering signal to ensure proper write. Due to the write-margin constraint, the write port of the SRAM cell 10 has to be sized such that the slowest pass-gate nMOS transistor must be able to overcome the strength of fastest (feedback) pull up pMOS transistor. To manage a preferred low area design, and further so as to limit leakage, the pass-gate nMOS transistor cannot be sized very large, and this results in a pMOS transistor that cannot be made very strong. In this configuration, it is the pMOS transistor that ends up defining the write time of a cell and thus limits the overall SRAM cell performance at low voltages.

To address the issue of providing an SRAM cell better suited to a low voltage implementation, it is known in the art to decouple the read and write ports of an SRAM cell. With such a configuration, the circuit designer can instead size the read and write ports independently so as to ensure the correctness and efficiency of both operations.

Figure 3A:
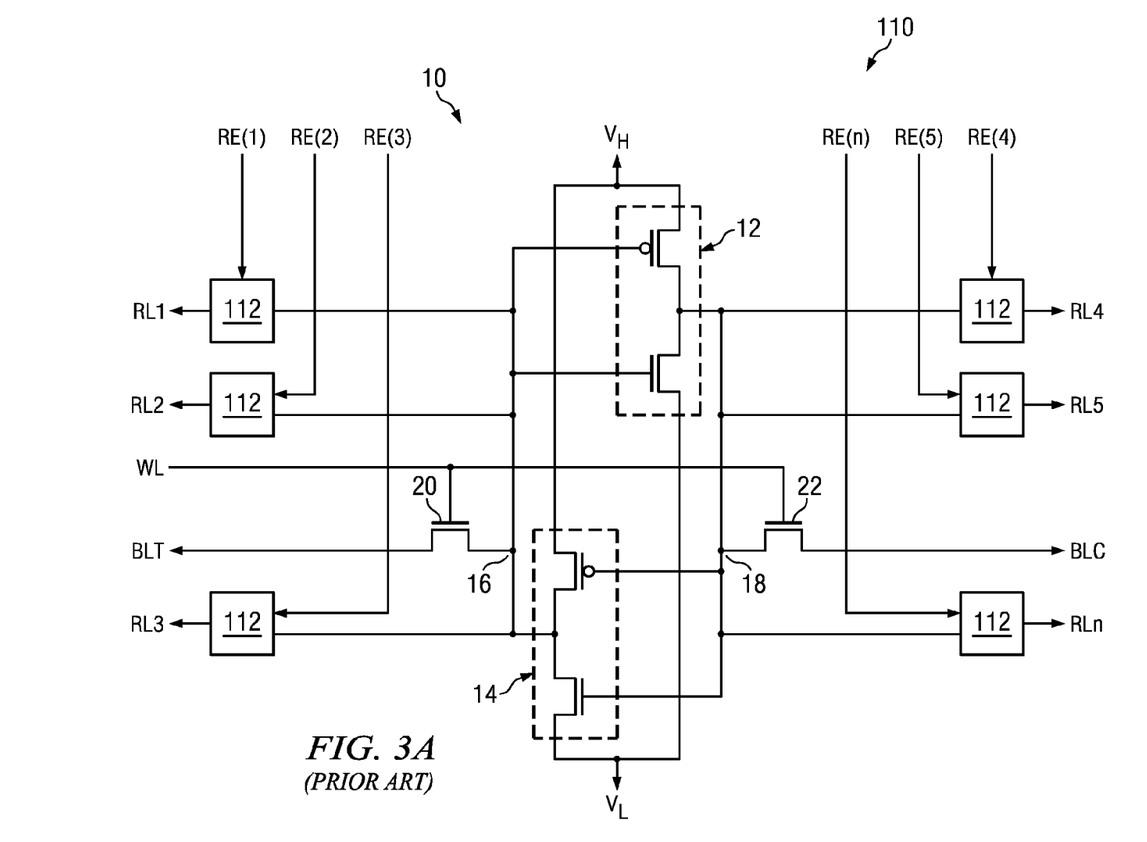
FIG. 3A is a schematic diagram of a multi-port static random access memory (SRAM) cell.

Reference is made to FIG. 3A which is a schematic diagram of a multiple read access port static random access memory (SRAM) cell 110. This SRAM cell 110 presents an architecture wherein the read and write ports are decoupled. The heart of the SRAM cell 110 is a standard six transistor (6T) static random access memory (SRAM) cell 10 (like that shown in FIG. 1). The cell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18. The cell 10 further includes two transfer (pass gate) transistors 20 and 22 whose gate terminals are coupled to a word line node and are typically controlled by the signal present on a word line (WL). It will be recognized that the transfer (pass gate) transistors 20 and 22 may alternatively be separately controlled by signals on a first and second word line. Transistor 20 is source-drain connected between the true node 16 and a node associated with the a true bit line (BLT). Transistor 22 is source-drain connected between the complement node 18 and a node associated with a complement bit line (BLC). The true bit line BLT and complement BLC are provided primarily for write operations and the supporting circuitry is designed to support that write operation.

The multiple read access port static random access memory (SRAM) cell 110 further includes a plurality of read access ports 112, wherein each port 112 is coupled to a read line RL(1)-RL(n) (which is typically in the form of a bit line presented in addition to the true bit line (BLT) and complement bit line (BLC) for the cell 10). Each read access port 112 is controlled by the signal present on a read enable node associated with a respective read enable (RE(1)-(RN(n)) line. The corresponding read enable lines for the corresponding true and complement read access ports 112 are typically connected together (i.e., responsive to a single read enable signal), but it will be understood that the true and complement read access ports 112 may alternatively be separately controlled by signals on separate read enable lines. The read lines RL may be presented in true and complement forms, if desired. The read lines RL are provided primarily for read operations and the supporting circuitry is designed to support that read operation.

The source terminals of the p-channel transistors in each inverter 12 and 14 are coupled to receive a high source voltage at a high voltage $V_H$ node, while the source terminals of the n-channel transistors in each inverter 12 and 14 are coupled to receive a low source voltage at a low voltage $V_L$ node. The high voltage $V_H$ and the low voltage $V_L$ comprise a power supply set of voltages for the cell 10. It will be recognized that separate low voltage $V_L$ values may be provided for the sources of the nMOS transistors in the inverters 12 and 14 while separate high voltage $V_H$ values may be provided for the sources of the pMOS transistors in the inverters 12 and 14.

Figure 3B:
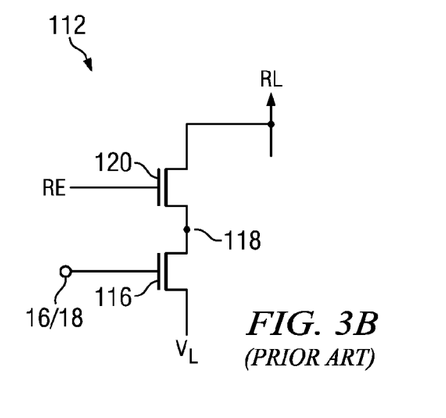
FIG. 3B is a schematic diagram of an embodiment for a read access port for use in the SRAM cell of FIG. 3A.

Reference is now made to FIG. 3B which is schematic diagram of an embodiment for a read access port 112 for use in the SRAM cell of FIG. 3A. The read access port 112 comprises a first transistor 116 whose gate receives the signal from the true node 16 or complement node 18 of the latch circuitry. The first transistor 116 is source-drain connected between a reference node (for example, the low voltage $V_L$ node) and an intermediate node 118. The read access port 112 further comprises a second transistor 120 whose gate is coupled to the read enable node and receives the signal present on the read enable (RE) line. The second transistor 120 is source-drain connected between the intermediate node 118 and a node associated with the read line RL.

Figure 3C:
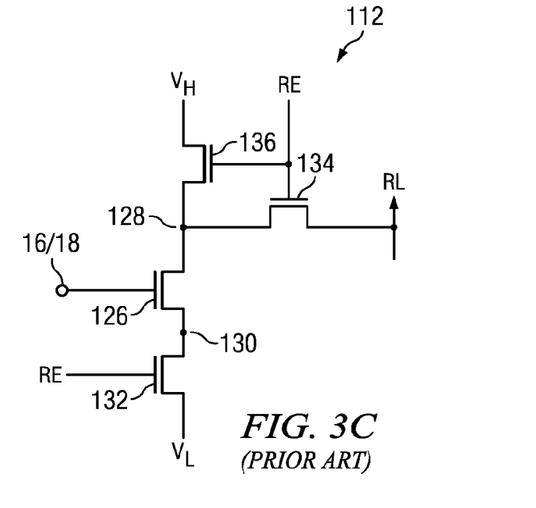
FIG. 3C is a schematic diagram of an embodiment for a read access port for use in the SRAM cell of FIG. 3A.

Reference is now made to FIG. 3C which is schematic diagram of an embodiment for a read access port 112 for use in the SRAM cell of FIG. 3A. The read access port 112 comprises a first transistor 126 whose gate receives the signal from the true node 16 or complement node 18 of the latch circuitry. The first transistor 126 is source-drain connected between a first intermediate node 128 and a second intermediate node 130. The read access port 112 further comprises a second transistor 132 whose gate is coupled to the read enable node and receives the signal present on the read enable (RE) line. The second transistor 132 is source-drain connected between the second intermediate node 130 and the reference node (for example, the low voltage $V_L$ node). The read access port 112 further comprises a third transistor 134 source-drain connected between the first intermediate node 128 and a node associated with the read line RL. The read access port 112 further comprises a fourth transistor 136 source-drain connected between the first intermediate node 128 and another reference node (for example, the high voltage $V_H$ node). The gates of the third and fourth transistors 134 and 136 are coupled together and are further coupled to the read enable node and receives the signal present on the read enable (RE) line.

The configuration of FIG. 3A permits write access to the true node 16 and complement node 18 through the two transfer (pass gate) transistors 20 and 22 via the true bit line (BLT) and complement bit line (BLC) using the word line (WL), as well as read access to the true node 16 and complement node 18 through the two read access ports 112 via the true read line RLT and complement read line RLC using the read enable (RE) line.

If the standard six transistor static random access memory (SRAM) cell 10 (like that shown in FIG. 1) used within the SRAM cell 110 is specifically provided for supporting the write operation, the pertinent transistors can be sized to best enable and support write operations. However, the pMOS transistor sizing is still constrained by a total leakage budget, write-ability and write time constraints, and thus a decoupled solution, while an improvement over conventional 6T SRAM cell configurations, is still deficient, especially in low voltage applications.

The prior art also teaches the use of Schmitt trigger cell to enhance SRAM cell stability (see, Kulkarni, "A 160 mV Robust Schmitt Trigger Base Subthreshold SRAM," IEEE Journal on Solid-State Circuits, vol. 42, no. 10, October 2007, the disclosure of which is incorporated by reference). The Schmitt trigger cell differs from the conventional 6T SRAM cell (FIG. 1) in the additional inclusion of four n-channel transistors connected in a manner well known in the art. However, the Schmitt trigger cell is not effective in terms of improving write operation (i.e., write-ability as well as write time).

Portable computers are reasonably pervasive today, and the trend is towards faster hand-held devices. These portable devices are expected to operate at much higher frequencies to enhance the user experience, and thus scaling of operating voltage is considered to be the most effective mechanism to reduce mobile device energy consumption. In this regard, high performance with a low voltage operation is desired. In the context of the modern system on chip (SoC) designs considered for such mobile devices, the included SRAM cells are recognized to substantially define the limits of possible voltage scaling (either because of performance or because of functionality). There is accordingly a need in the art for an SRAM cell design that addresses the deficiencies of the noted prior art in supporting low voltage operation.

SUMMARY

In an embodiment, a memory cell comprises: a latch circuit having a true node and a complement node; a first true bit line node; a first complement bit line node; a first transistor source-drain coupled between the first true bit line node and the true node of the latch circuit, a control terminal of the first transistor coupled to a first word line node; a second transistor source-drain coupled between the first complement bit line node and the complement node of the latch circuit, a control terminal of the second transistor coupled to a second word line node; a third transistor source-drain coupled between the true node and the first word line node, a control terminal of the third transistor coupled to the first complement bit line node; and a fourth transistor source-drain coupled between the complement node and the second word line node, a control terminal of the fourth transistor coupled to the first true bit line node.

In an embodiment, a memory cell comprises: a true bit line node; a complement bit line node; a storage latch coupled between the true bit line node and the complement bit line node, said latch further having an internal true node and an internal complement node; a word line; a first transistor source-drain coupled between the internal true node and the word line node, a control terminal of the first transistor coupled to receive a signal from the complement bit line node; and a second transistor source-drain coupled between the internal complement node and the word line node, a control terminal of the second transistor coupled to receive a signal from the true bit line node.

In an embodiment, a memory cell comprises: a first true bit line node; a second true bit line node; a first complement bit line node; a second complement bit line node; a storage latch coupled between the first and second true bit line nodes and the first and second complement bit line nodes, said storage latch further having an internal true node and an internal complement node; a first word line node; a second word line node; a first transistor source-drain coupled between the internal true node and the first word line node, a control terminal of the first transistor coupled to receive a signal from the first complement bit line node; a second transistor source-drain coupled between the internal complement node and the first word line node, a control terminal of the second transistor coupled to receive a signal from the true bit line node; a third transistor source-drain coupled between the true node and the second word line node, a control terminal of the third transistor coupled to receive a signal from the second complement bit line node; and an fourth transistor source-drain coupled between the complement node and the second word line node, a control terminal of the fourth transistor coupled to receive a signal from the second true bit line node.

BRIEF DESCRIPTION OF THE DRAWINGS

For a better understanding of the embodiments, reference will now be made by way of example only to the accompanying figures in which.

DETAILED DESCRIPTION OF THE DRAWINGS

FIGS. 1-3C have been previously described.

Figure 4:
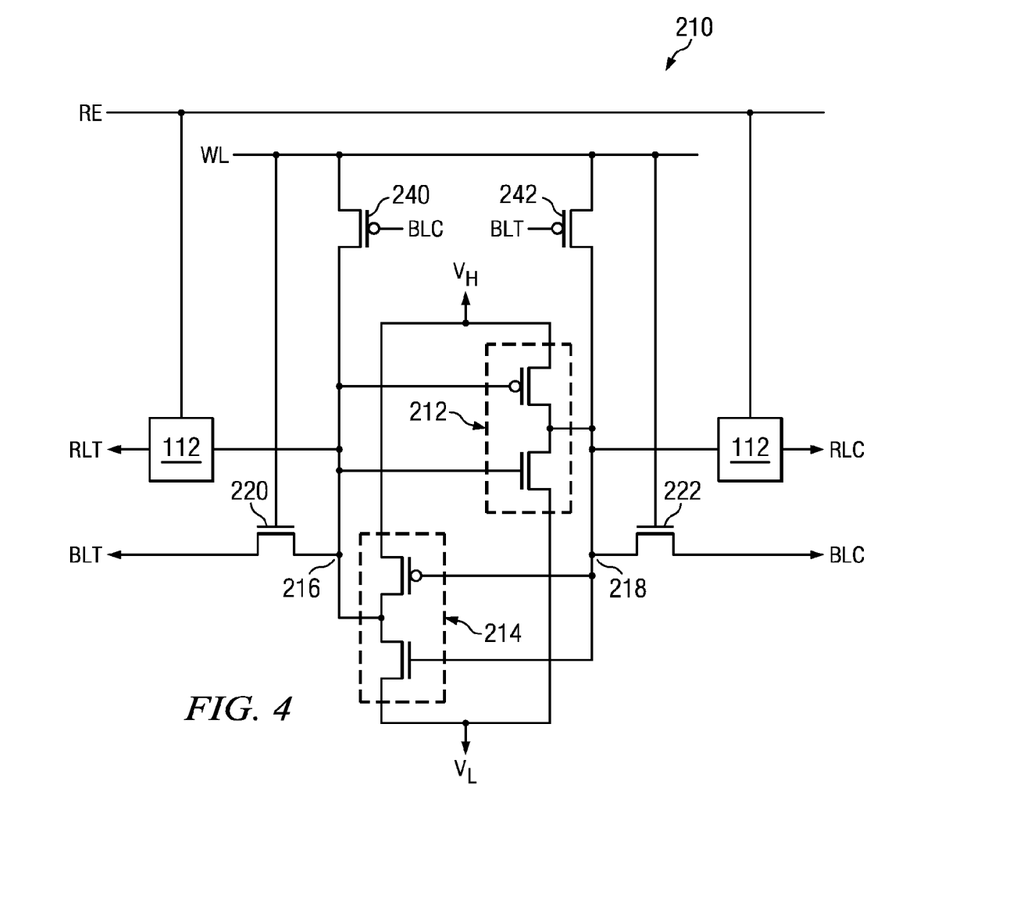
FIG. 4 is a schematic diagram of an eight transistor static random access memory (SRAM) cell in accordance with an embodiment.

Reference is made to FIG. 4 which is a schematic diagram of an eight transistor static random access memory (SRAM) cell 210. The cell 210 includes two cross-coupled CMOS inverters 212 and 214, each inverter including a series connected p-channel and n-channel transistor pair forming the latch circuit. The inputs and outputs of the inverters 212 and 214 are coupled to form a latch circuit having a true node 216 and a complement node 218. The cell 210 further includes two transfer (pass gate) transistors 220 and 222 whose gate terminals are coupled to a word line node and are controlled by the signal present on a word line (WL). It will be recognized that the transfer (pass gate) transistors 220 and 222 may alternatively be separately controlled by signals on a first and second word line (associated with first and second word line nodes). Transistor 220 is source-drain connected between the true node 216 and a node associated with a true bit line (BLT). Transistor 222 is source-drain connected between the complement node 218 and a node associated with a complement bit line (BLC).

The cell 210 still further includes two transistors 240 and 242 whose gate terminals are cross-coupled to the bit line nodes and are controlled by the signals present on the true bit line (BLT) and complement bit line (BLC). Specifically, the gate of transistor 240 (on the true node side of the latch circuitry) is controlled by the signal on the node associated with the complement bit line (BLC), while the gate of transistor 242 (on the complement node side of the latch circuitry) is controlled by the signal on the node associated with the true bit line (BLT). Transistor 240 is source-drain connected between the true node 216 and the node associated with the word line (WL). Transistor 242 is source-drain connected between the complement node 218 and the node associated with the word line (WL). It will be recognized that the transistors 240 and 242 may alternatively be separately connected at their source terminals to separate nodes for first and second word lines (if provided to separately control the transfer (pass gate) transistors 220 and 222 as described above).

The eight transistor static random access memory (SRAM) cell 210 is accordingly an enhancement of the standard 6T SRAM cell (FIG. 1), as well as an enhancement over the conventional Schmitt trigger SRAM cell, in the inclusion of two additional pMOS devices per write-enabled port. These two additional pMOS devices are coupled to a standard SRAM (6T, Schmitt, or the like) cell configuration in a manner with one pMOS device (transistor 240) source-drain coupled between the word line WL and true node 216 and another pMOS device (transistor 242) source-drain coupled between the word line WL and complement node 218. The gates of the two pMOS devices are cross-coupled to the bit lines, with the gate of one pMOS device (transistor 240 for the true node 216) coupled to the complement bit line BLC and the gate of the other pMOS device (transistor 242 for the complement node 218) coupled to the true bit line BLT.

In operation, the two additional pMOS devices function as current sources which are selectively actuated to source additional current from the actuated word line node into the true or complement node of the latch circuitry during write mode in order to assist in driving that latch node towards the high voltage $V_H$ reference. Thus, when the word line goes logic high, and a logic low signal is applied during write mode to the complement bit line BLC, the transistor 240 is turned on and current is sourced into the true node 216 of the latch circuitry to assist the operation of the inverter 212 and access transistor 220 to drive the true node to the high voltage $V_H$ reference. Conversely, when the word line goes logic high, and a logic low signal is applied during write mode to the true bit line BLT, the transistor 242 is turned on and current is sourced into the complement node 218 of the latch circuitry to assist the operation of the inverter 214 and access transistor 222 to drive the complement node to the high voltage $V_H$ reference. The result is an overall improvement in write time of the memory cell.

The source terminals of the p-channel transistors in each inverter 212 and 214 are coupled to receive a high source voltage at a high voltage $V_H$ node, while the source terminals of the n-channel transistors in each inverter 212 and 214 are coupled to receive a low source voltage at a low voltage $V_L$ node. The high voltage $V_H$ and the low voltage $V_L$ comprise a power supply set of voltages for the cell 210. Conventionally, the high voltage $V_H$ is a positive voltage (for example, 1.5V) and the low voltage $V_L$ is a ground voltage (for example, 0V). In an integrated circuit including the SRAM cell 210, this power supply set of voltages may be received at pins of the integrated circuit, or may instead be generated on chip by a voltage converter circuit which receives some other set of voltages received from the pins of the chip. The power supply set of voltages $V_H$ and $V_L$ are conventionally applied to the SRAM cell 210 at all times that the cell/integrated circuit is operational. It will be recognized that separate low voltage $V_L$ values may be provided for the sources of the nMOS transistors in the inverters 212 and 214 while separate high voltage $V_H$ values may be provided for the sources of the pMOS transistors in the inverters 212 and 214.

The static random access memory (SRAM) cell 210 may be used within a static random access memory (SRAM) array of the type shown in FIG. 2.

The static random access memory (SRAM) cell 210 may optionally include a plurality of read access ports 112, wherein each port 112 is coupled to a read line (for example, two such ports, one true and one complement, are shown in FIG. 4 coupled to true and complement read lines RLT and RLC). The read lines are typically in the form of a bit line presented in addition to the true bit line (BLT) and complement bit line (BLC) for the cell 210). Each read access port 112 is controlled by the signal present on a respective read enable RE line. The corresponding read enable lines for the corresponding true and complement read access ports 112 are typically connected together (i.e., responsive to a single read enable signal), but it will be understood that the true and complement read access ports 112 may alternatively be separately controlled by signals on separate read enable lines.

The read access ports 112 may take any suitable circuit form including the forms shown in FIGS. 3B and 3C.

Figure 5:
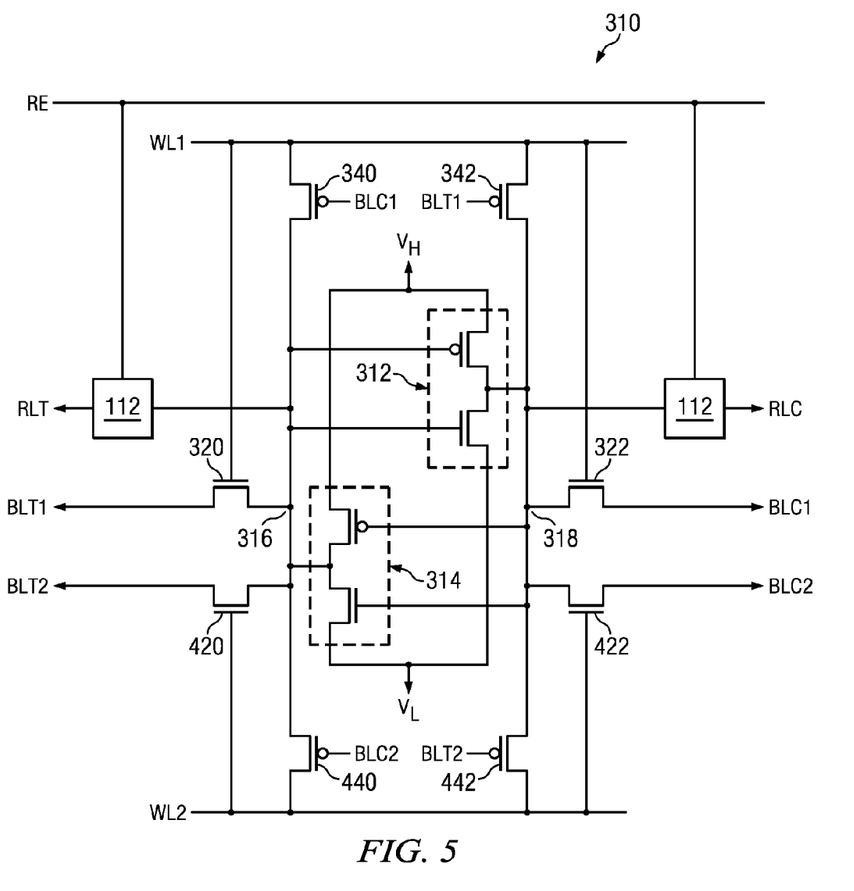
FIG. 5 is a schematic diagram of a dual port static random access memory (SRAM) cell in accordance with an embodiment.

Reference is made to FIG. 5 which is a schematic diagram of a dual port static random access memory (SRAM) cell 310. The cell 310 includes two cross-coupled CMOS inverters 312 and 314, each inverter including a series connected p-channel and n-channel transistor pair forming a latch circuit. The inputs and outputs of the inverters 312 and 314 are coupled to form the latch circuit having a true node 316 and a complement node 318. The cell 310 further includes two transfer (pass gate) transistors 320 and 322 whose gate terminals are coupled to a word line node and are controlled by the signal present on a first word line (WL1). It will be recognized that the transfer (pass gate) transistors 320 and 322 may alternatively be separately controlled by different first word line signals provided by different word line nodes. Transistor 320 is source-drain connected between the true node 316 and a node associated with a first true bit line (BLT1). Transistor 322 is source-drain connected between the complement node 318 and a node associated with a first complement bit line (BLC1).

The cell 310 further includes two transfer (pass gate) transistors 420 and 422 whose gate terminals are coupled to a word line node and controlled by the signal present on a second word line (WL2). It will be recognized that the transfer (pass gate) transistors 420 and 422 may alternatively be separately controlled by different nodes associated with plural second word line signals. Transistor 420 is source-drain connected between the true node 316 and a node associated with a second true bit line (BLT2). Transistor 422 is source-drain connected between the complement node 318 and a node associated with a second complement bit line (BLC2).

The cell 210 still further includes two transistors 340 and 342 whose gate terminals are controlled by the signals present on the nodes of the first true bit line (BLT1) and first complement bit line (BLC1). Specifically, the gate of transistor 340 (on the true node side of the latch circuitry) is controlled by the signal on the node associated with the first complement bit line (BLC1), while the gate of transistor 342 (on the complement side of the latch circuitry) is controlled by the signal on the node associated with the first true bit line (BLT1). Transistor 340 is source-drain connected between the true node 316 and the node for the first word line (WL1). Transistor 342 is source-drain connected between the complement node 318 and the node for the first word line (WL1). It will be recognized that the transistors 340 and 342 may alternatively be separately connected at their source terminals to separate nodes for separate first word lines (if provided to separately control the transfer (pass gate) transistors 320 and 322 as described above).

The cell 210 still further includes two transistors 440 and 442 whose gate terminals are coupled to bit line nodes and are controlled by the signals present on the second true bit line (BLT2) and second complement bit line (BLC2). Specifically, the gate of transistor 440 (on the true node side of the latch circuitry) is controlled by the signal on the node associated with the second complement bit line (BLC2), while the gate of transistor 442 (on the complement node side of the latch circuitry) is controlled by the signal on the node associated with the second true bit line (BLT2). Transistor 440 is source-drain connected between the true node 316 and the node associated with the second word line (WL2). Transistor 442 is source-drain connected between the complement node 318 and the node associated with the second word line (WL2). It will be recognized that the transistors 440 and 442 may alternatively be separately connected at their source terminals to separate nodes for separate second word lines (if provided to separately control the transfer (pass gate) transistors 420 and 422 as described above).

The dual port static random access memory (SRAM) cell 310 is accordingly an enhancement of the standard SRAM cell designs, in the inclusion of two additional pMOS devices per write-enabled port. As there are two write-enabled ports in the SRAM cell 310, the enhancement adds four additional pMOS device.

The first two additional pMOS devices are coupled to the SRAM cell configuration in a manner with one pMOS device (transistor 340) source-drain coupled between the first word line WL1 and true node 316 and another pMOS device (transistor 342) source-drain coupled between the first word line WL1 and complement node 218. The gates of the two pMOS devices are cross-coupled to the first bit lines, with the gate of one pMOS device (transistor 340 for the true node 316) coupled to the first complement bit line BLC1 and the gate of the other pMOS device (transistor 342 for the complement node 318) coupled to the first true bit line BLT1.

The second two additional pMOS devices are coupled to the SRAM cell configuration in a manner with one pMOS device (transistor 440) source-drain coupled between the second word line WL2 and true node 316 and another pMOS device (transistor 442) source-drain coupled between the second word line WL2 and complement node 318. The gates of the two pMOS devices are cross-coupled to the second bit lines, with the gate of one pMOS device (transistor 440 for the true node 316) coupled to the second complement bit line BLC2 and the gate of the other pMOS device (transistor 442 for the complement node 318) coupled to the second true bit line BLT2.

In operation, the two additional pMOS devices per write-enabled port function as current sources which are selectively actuated to source additional current from the actuated word line node into the true or complement node of the latch circuitry during write mode in order to assist in driving that latch node towards the high voltage $V_H$ reference. Thus, when the first word line WL1 goes logic high, and a logic low signal is applied during write mode to the first complement bit line BLC1, the transistor 340 is turned on and current is sourced into the true node 316 of the latch circuitry to assist the operation of the inverter 312 and access transistor 320 to drive the true node to the high voltage $V_H$ reference. Conversely, when the first word line WL1 goes logic high, and a logic low signal is applied during write mode to the first true bit line BLT1, the transistor 342 is turned on and current is sourced into the complement node 318 of the latch circuitry to assist the operation of the inverter 314 and access transistor 322 to drive the complement node to the high voltage $V_H$ reference. A similar operation occurs with respect to transistors 440 and 442, in response the second word line WL2, using the control signals supplied from the second set of bit lines (BLT2 and BLC2). The result is an overall improvement in write time of the memory cell with respect to each of the write-enabled ports.

The source terminals of the p-channel transistors in each inverter 312 and 314 are coupled to receive a high source voltage at a high voltage $V_H$ node, while the source terminals of the n-channel transistors in each inverter 312 and 314 are coupled to receive a low source voltage at a low voltage $V_L$ node. The high voltage $V_H$ and the low voltage $V_L$ comprise a power supply set of voltages for the cell 310. Conventionally, the high voltage $V_H$ is a positive voltage (for example, 1.5V) and the low voltage $V_L$ is a ground voltage (for example, 0V). In an integrated circuit including the SRAM cell 310, this power supply set of voltages may be received at pins of the integrated circuit, or may instead be generated on chip by a voltage converter circuit which receives some other set of voltages received from the pins of the chip. The power supply set of voltages $V_H$ and $V_L$ are conventionally applied to the SRAM cell 310 at all times that the cell/integrated circuit is operational. It will be recognized that separate low voltage $V_L$ values may be provided for the sources of the nMOS transistors in the inverters 312 and 314 while separate high voltage $V_H$ values may be provided for the sources of the pMOS transistors in the inverters 312 and 314.

The static random access memory (SRAM) cell 310 may be used within a static random access memory (SRAM) array of the type shown in FIG. 2.

The static random access memory (SRAM) cell 310 may optionally include a plurality of read access ports 112, wherein each port 112 is coupled to a read line (for example, two such ports, one true and one complement, are shown in FIG. 5 coupled to true and complement read lines RLT and RLC). The read lines are typically in the form of a bit line presented in addition to the true bit lines (BLT1 and BLT2) and complement bit lines (BLC1 and BLC2) for the cell 310). Each read access port 112 is controlled by the signal present on a respective read enable RE line. The corresponding read enable lines for the corresponding true and complement read access ports 112 are typically connected together (i.e., responsive to a single read enable signal), but it will be understood that the true and complement read access ports 112 may alternatively be separately controlled by signals on separate read enable lines.

The read access ports 112 may take any suitable circuit form including the forms shown in FIGS. 3B and 3C.

The SRAM cells of FIGS. 4 and 5 present an advantage over conventional SRAM cell configurations. The inclusion of the two additional pMOS devices per write-enabled port significantly improves the write time of the memory cell as a result of the use of boost from the word line WL through the additional pMOS devices to the true and complement nodes (216, 218, 316 and 318).

Although not explicitly illustrated, it will be understood that each of the included transistors had a body region, and that the body regions of one or more or all of the included transistors may be separately biased, with a controllable or settable bias voltage.

The SRAM cells of FIGS. 4 and 5 may use any appropriate circuitry for forming the storage latch (such as the circuitry well known from the standard 6T SRAM cell or Schmitt trigger SRAM cell, or the like SRAM cell or other latching memory cell known to those skilled in the art). See, Kulkarni, "A 160 mV Robust Schmitt Trigger Base Subthreshold SRAM," IEEE Journal on Solid-State Circuits, vol. 42, no. 10, October 2007, the disclosure of which is incorporated by reference.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A memory cell, comprising:
a latch circuit having a true node and a complement node;
a first true bit line node;
a first complement bit line node;
a first transistor source-drain coupled between the first true bit line node and the true node of the latch circuit, a control terminal of the first transistor coupled to a first word line node;
a second transistor source-drain coupled between the first complement bit line node and the complement node of the latch circuit, a control terminal of the second transistor coupled to a second word line node;
a third transistor source-drain coupled between the true node and the first word line node, a control terminal of the third transistor coupled to the first complement bit line node; and
a fourth transistor source-drain coupled between the complement node and the second word line node, a control terminal of the fourth transistor coupled to the first true bit line node.

2. The memory cell of claim 1, wherein the first word line node and second word line node comprise a first common word line node.

3. The memory cell of claim 1, further comprising a first read access port circuit coupled between the true node and a first read line, wherein actuation of said first read access port circuit is controlled by a read enable signal.

4. The memory cell of claim 1, wherein the third and fourth transistors are pMOS devices.

5. The memory cell of claim 1, further comprising:
a second true bit line node;
a second complement bit line node;
a fifth transistor source-drain coupled between the second true bit line node and the true node of the latch circuit, a control terminal of the fifth access transistor coupled to a third word line node;
a sixth access transistor source-drain coupled between the second complement bit line node and the complement node of the latch circuit, a control terminal of the sixth access transistor coupled to a fourth word line node;
a seventh transistor source-drain coupled between the true node and the third word line node, a control terminal of the seventh transistor coupled to the second complement bit line node; and
an eighth transistor source-drain coupled between the complement node and the fourth word line node, a control terminal of the eighth transistor coupled to the second true bit line node.

6. The memory cell of claim 5, wherein the third word line node and fourth word line node comprise a second common word line node.

7. The memory cell of claim 5, further comprising a first read access port circuit coupled between the true node and a first read line, wherein actuation of said first read access port circuit is controlled by a read enable signal.

8. The memory cell of claim 5, wherein the seventh and eighth transistors are pMOS devices.

9. The memory cell of claim 1, wherein the latch circuit comprises a first inverter coupled between the true node and the complement node and a second inverted coupled between the complement node and the true node.

10. A memory cell, comprising:
a true bit line node;
a complement bit line node;

a storage latch coupled between the true bit line node and the complement bit line node, said storage latch further having an internal true node and an internal complement node;

a word line node;

a first transistor source-drain coupled between the internal true node and the word line node, a control terminal of the first transistor coupled to receive a signal from the complement bit line node; and a second transistor source-drain coupled between the internal complement node and the word line node, a control terminal of the second transistor coupled to receive a signal from the true bit line node.

11. The memory cell of claim 10, wherein the first and second transistors are pMOS devices.

12. The memory cell of claim 10, wherein the storage latch comprises an SRAM cell.

13. The memory cell of claim 10, wherein the storage latch comprises a Schmitt trigger SRAM cell.

14. A memory cell, comprising:

a first true bit line node;

a second true bit line node;

a first complement bit line node;

a second complement bit line node;

a storage latch coupled between the first and second true bit line nodes and the first and second complement bit line nodes, said storage latch further having an internal true node and an internal complement node;

a first word line node;

a second word line node;

a first transistor source-drain coupled between the internal true node and the first word line node, a control terminal of the first transistor coupled to receive a signal from the first complement bit line node;

a second transistor source-drain coupled between the internal complement node and the first word line node, a control terminal of the second transistor coupled to receive a signal from the first true bit line node;

a third transistor source-drain coupled between the true node and the second word line node, a control terminal of the third transistor coupled to receive a signal from the second complement bit line node; and an fourth transistor source-drain coupled between the complement node and the second word line node, a control terminal of the fourth transistor coupled to receive a signal from the second true bit line node.

15. The memory cell of claim 14, wherein the first, second, third and fourth transistors are pMOS devices.

16. The memory cell of claim 14, wherein the storage latch comprises an SRAM cell.

17. The memory cell of claim 14, wherein the storage latch comprises a Schmitt trigger SRAM cell.

* * * * *